US005594900A

United States Patent [19]

Cohn et al.

[11] Patent Number: 5,594,900
[45] Date of Patent: Jan. 14, 1997

[54] SYSTEM AND METHOD FOR PROVIDING A BACKUP COPY OF A DATABASE

[75] Inventors: Oded Cohn, Haifa; Kenneth Nagin, Nazereth; Yoram Novick; Alex Winokur, both of Haifa, all of Israel

[73] Assignee: International Business Machines Corporation, Armonk, N.Y.

[21] Appl. No.: 409,478

[22] Filed: Mar. 22, 1995

Related U.S. Application Data

[63] Continuation of Ser. No. 158,103, Nov. 23, 1993, abandoned.

[30] Foreign Application Priority Data

Dec. 2, 1992 [GB] United Kingdom .................. 9225210

[51] Int. Cl.⁶ .................................................. G06F 13/14
[52] U.S. Cl. ........................ 395/600; 395/200; 395/575; 395/700; 364/231.1; 364/265; 364/DIG. 1
[58] Field of Search ................................... 395/600, 575, 395/200, 700

[56] References Cited

U.S. PATENT DOCUMENTS

| | | | |
|---|---|---|---|
| 4,159,517 | 6/1979 | Paradine et al. ........................ | 395/250 |
| 4,274,139 | 6/1981 | Hodgkinson et al. .................. | 395/200 |
| 4,507,751 | 3/1985 | Gawlick et al. ........................ | 395/575 |
| 4,819,159 | 4/1989 | Shipley et al. ......................... | 395/575 |
| 4,868,744 | 9/1989 | Reinsch et al. ......................... | 395/575 |
| 4,977,500 | 12/1990 | Ogata et al. ........................... | 395/575 |
| 5,043,866 | 8/1991 | Myre, Jr. et al. ....................... | 395/600 |
| 5,043,871 | 8/1991 | Nishigaki et al. ...................... | 395/600 |
| 5,140,689 | 8/1992 | Kobayashi ............................... | 395/575 |
| 5,155,678 | 10/1992 | Fukumoto et al. ...................... | 395/425 |
| 5,157,663 | 10/1992 | Major et al. ............................ | 371/9.1 |
| 5,170,480 | 12/1992 | Mohan et al. .......................... | 395/600 |
| 5,193,168 | 3/1993 | Corrigan et al. ....................... | 395/425 |
| 5,263,154 | 1/1993 | Eastridge et al. ...................... | 395/575 |
| 5,327,539 | 7/1994 | Ainsworth et al. ..................... | 395/575 |
| 5,379,412 | 1/1995 | Eastridge et al. ...................... | 395/575 |

OTHER PUBLICATIONS

"Tandem's Remote Data Facility"; Jim Lyon; IEEE, pp. 562–567; 1990.
"Overview of Disaster Recovery For Transaction Processing System"; King et al. IEEE, 1990; pp. 286–293.
"Issues In Disaster Recovery"; Hector Garcia–Molina & Christos A. Polyzois; IEEE, 1990. pp. 573–577.
"Design Approaches For Real–Time Transaction Processing Remote Site Recovery"; D. L. Burkes & R. K. Treiber; IEEE; 1990; pp. 568–572.

*Primary Examiner*—Thomas G. Black
*Assistant Examiner*—C. Pham
*Attorney, Agent, or Firm*—Esther E. Klein

[57] ABSTRACT

A backup method for a computer database system comprising maintaining a mirrored copy of the database at a remote location is characterized in that updates to the remote database data are delayed for a delay time greater than or equal to the upper limit on the data communication delay between the local location and the remote location and updates to a remote log for the database are executed after corresponding updates to a local log without said delay. In this way a consistent copy of the database may be recovered from the mirrored copy of the database and the remote log after destruction of the database system.

6 Claims, 2 Drawing Sheets

SYSTEM AND METHOD FOR PROVIDING A BACKUP COPY OF A DATABASE

This application is a continuation of application Ser. No. 08/158,103, now abandoned.

FIELD OF THE INVENTION

The invention relates to backup methods for computer systems and, more particularly, to such methods which enable data recovery in the event of complete destruction of a computer installation.

BACKGROUND OF THE INVENTION

With the growing dependency of organizations on electronically stored data, it has become necessary to devise backup methods and recovery procedures for all possible situations which may result in data being lost. One class of recovery procedures is the disaster recovery procedure. Its purpose is to perform a recovery in the case of a total destruction of the computing facility. If no special measures are taken the only recovery possible in this case would be a reconstruction of the data on another facility from a backup which is kept at a remote location, and which thus survives the disaster.

One possible disaster recovery strategy is known as Mirroring. This involves the continuous maintenance of a mirror copy of the data at a remote computing site. When a destruction occurs the remote site will take over using the mirrored data.

However, for the reasons explained below, the mirroring strategy is not appropriate for systems, such as database management systems, in which data sets are interdependent so that a change in one data set requires a corresponding change or changes in others of the data sets to ensure consistency of the data.

A file system is said to be consistent if it represents a state of the data set system after applying a series of complete logical updates or transactions. When a system failure occurs the file system is normally in an inconsistent state because some updates have not been completed. It is up to the recovery procedure to bring the file system back to a consistent state. A good recovery procedure will also bring the file system to its closest consistent state. By closest consistent state is meant a state which reflects all transactions except those which were disrupted at the time of failure. More generally, the closeness of a recovered file system to its copy before failure can be measured in the number of complete transactions required to bring it to its closest consistent state.

A data set is said to be insensitive to failures if after any system failure, apart from a crash of the device on which it resides, it remains consistent. This type of a data set cannot corrupt the consistency of the file system to which it belongs. Most of the sequential files maintained by the operating systems TSO and CMS belong to this category.

A data set is said to be sensitive to failure if there is a possibility that upon system failure it will become inconsistent or will cause the file system to become inconsistent. Most database files belong to this category.

File systems generally consist of the following three types of data sets:

1. Database application data sets. These data sets are mainly used to hold the application information in a database environment. Data sets belonging to this class are sensitive to failures.

2. The database log data sets. These data sets hold data, generated by the database management system, which is intended to aid the recovery procedure in bringing the sensitive database data sets back to a consistent state. Data sets belonging to this class are insensitive to failures.

3. Simple data sets. These are the non-database files. These data sets are also insensitive to failures.

Most conventional Data Base Management Systems use, in one way or another, a single insensitive file to assist in the recovery of sensitive data sets in the event of, say, a power failure which does not result in the destruction of the storage devices on which the data is stored.

On the face of it, the mirroring strategy guarantees that no data is lost. However, in practice, there are severe problems with implementing this strategy. The main problem is that, due to communication delays on the link between the two sites, updates at the remote site do not occur simultaneously with updates at the local site.

Thus, when a disaster occurs the mirrored volumes will be in an unknown state since some data would have been lost due to communication delays. Some complete transactions will be missing from the mirrored disks and some transactions will be partially completed leaving the file system in an inconsistent state.

While the case where a small number of complete transactions are missing may sometimes be tolerated, being left with an inconsistent file system is totally unacceptable. Unless some very complicated measures, such as imposing some order on updates at the remote site, are taken, it is almost impossible to bring such a file system back to a consistent state after a disaster occurs.

For these reasons, to ensure that the mirrored copy of a complex file system at the remote site is always recoverable, it is necessary to delay the confirmation of a correct completion of all write operations in the local site until the data is safely written to the remote site. Such a delay seriously impairs the response time to updates.

Another approach to disaster recovery which can be used with log-based systems is known as check pointing. This involves the storage of some initial state of the database and the continuous updating of the log at the remote site. When a disaster occurs the entire database may be reconstructed at the remote site from this initial state and the log.

Check pointing does not require a delayed confirmation for the writes to the local log, because the database itself is not continuously updated at the remote site. The closeness of the recovered file system depends on the state of the remote log at the time of the crash. If the log is up-to-date the recovered file system will be in its closest consistent state, otherwise it will be in some other more "distant" consistent state. If confirmation for writes to the log at the local site are delayed until the remote site confirms that the remote log is correctly updated, then the recovery will always be to the closest consistent state. However, the recovery procedures based on this strategy are very inefficient since they normally take a long time to reconstruct a file system from its log.

SUMMARY OF THE INVENTION

This invention provides a backup method for a computer database system comprising maintaining a mirrored copy of the database at a remote location characterized in that updates to the remote database data are delayed for a delay time greater than or equal to the upper limit on the data communication delay between the local location and the remote location and updates to a remote log for the database are executed after corresponding updates to a local log without said delay, whereby a consistent copy of the database may be recovered from the mirrored copy of the database and the remote log after destruction of the database system.

The invention also provides a recovery method for a computer database system which has been backed up using the above method, the recovery method comprising updating the remote database data by executing the remote log entries against the remote database data starting from an entry in the remote log a number of entries back from the end of the remote log greater than the maximum number of log entries which may be written in the same delay time and executing a recovery procedure on the updated database data using the remote log.

The proposed method combines the advantages of the remotely mirrored log, i.e. checkpointing, and a remotely mirrored file system. On the one hand the recovery is almost as quick as using the conventional mirroring approach. However, it has the advantage that delayed confirmation for writes is not required for the mirrored database and therefore the normal response time to write operations is not degraded to a great extent, delayed confirmation being only required for the log, and even then only if it is required to recover to the closest consistent state.

If it is not required to be able to recover to the closest consistent state confirmation of a successful write to the local log can be performed prior making a corresponding update to the remote log. Otherwise confirmation of a successful write to the local log is performed after having made a corresponding update to the remote log.

Another aspect of the invention provides a data storage system connectable to and for use with a computer database system and a remote data storage system, comprising logic for executing a write instruction received from the computer database system; logic for communicating the write instruction to the remote data storage system for execution therein; logic for determining from the write instruction whether the write is to a portion of memory reserved for a database log, wherein the communication of the write instruction to a portion of storage in the remote data storage system not reserved for the database log is delayed for a time equal to the upper limit on the data communication delay between the data storage system and the remote data storage system.

If the write instructions communicated to the remote data storage system are executed against a copy of the database data stored therein, a consistent copy of the database may be recovered from the data stored on the remote data storage system after destruction of the data storage system.

The data storage system can be in the form of a disk controller connectable to a host processor, one or more disk drive units and a remote similar disk controller.

Thus, since the invention can be implemented by peer to peer communication between storage control units, the mirrored data maintenance procedure is application independent. All maintenance is done at the disk extent level without the need of a full understanding of the file system semantic and structure. Also, existing applications and database management systems need not be altered to implement the mirroring procedure. In fact they need not even be aware of the process.

BRIEF DESCRIPTION OF THE DRAWINGS

A preferred embodiment of the invention will now be described, by way of example only, with reference to the accompanying drawing wherein.

DETAILED DESCRIPTION OF THE INVENTION

Figure 1:
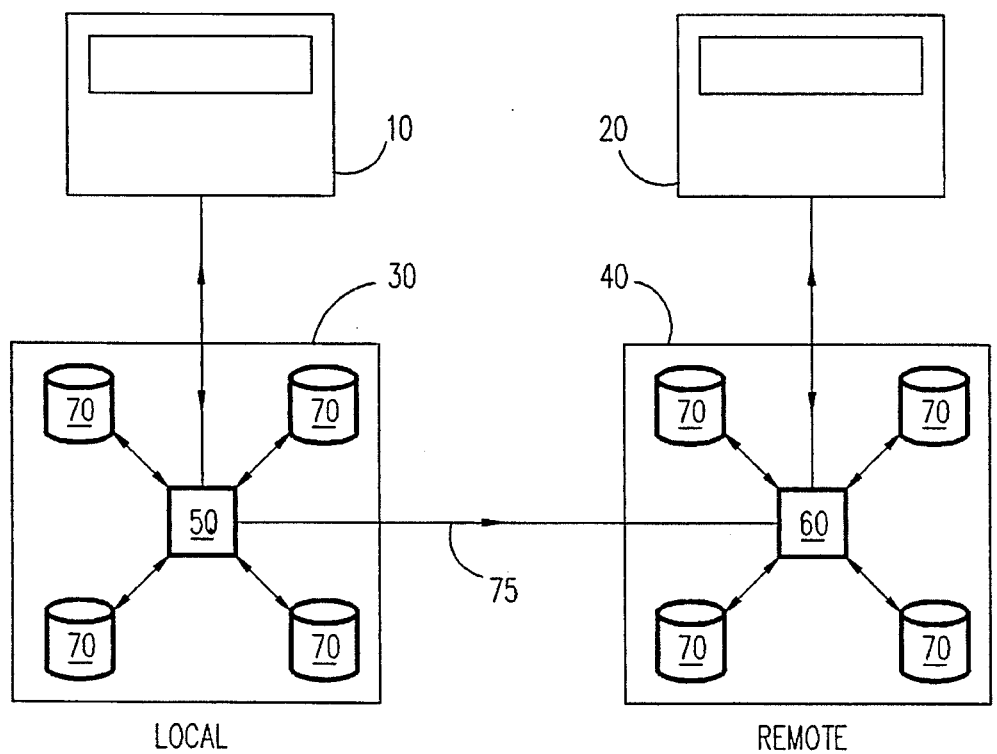
FIG. 1 is a schematic view of computer systems at local and remote sites.

Referring to FIG. 1, a computer system comprises two host CPUs 10 and 20, such as one of the IBM ES/9000 family of mainframe computers, at local and remote sites. Each CPU has its own data storage system 30, 40 which themselves comprise disk controller units 50, 60, such as the IBM 3990 disk controller unit, and disk drive units 70, for example the IBM 3390 disk drive. Local and remote disk control units 50 and 60 are connected by peer to peer communication channel 75.

Figure 2:
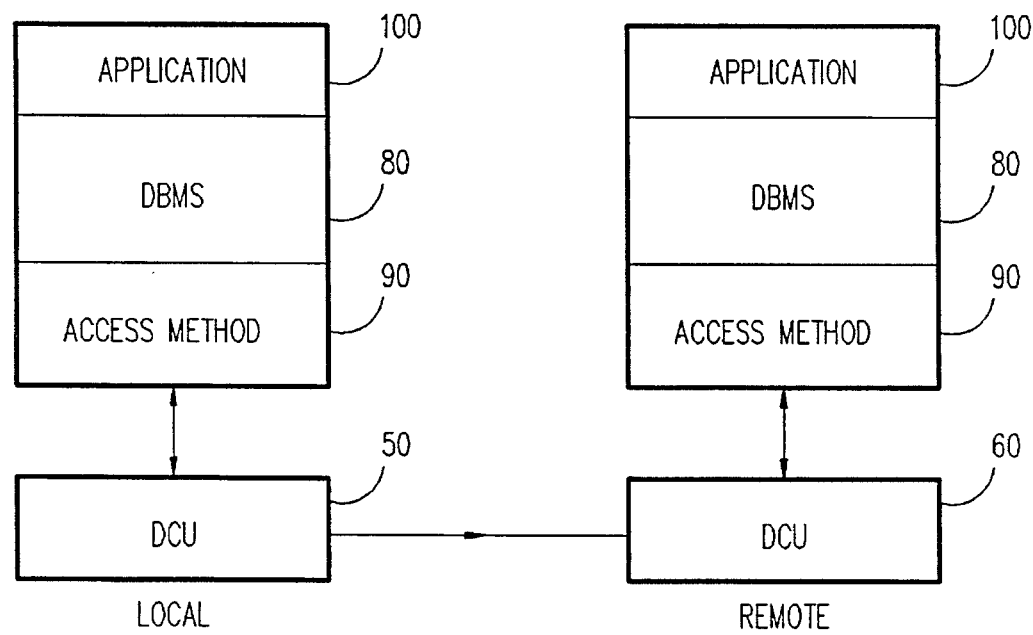
FIG. 2 is a schematic view of the software used in the computer systems at local and remote sites.

FIG. 2 is a schematic diagram showing the interaction of the software elements running on the computer system. A database management system (DBMS) 80, such as the IBM DB2 data base management system interfaces to an access method 90 which is part of the operating system of the computer. The access method enables the DBMS to access the data storage system via an interface with microcode on the disk control units 50, 60. DBMS 80 supports an application 100 by means of which a user can retrieve and manipulate data held in the database. Application 100 could, for example, be a program to organize the payroll of an enterprise.

When the system is set up, the extents (disk addresses and track addresses) which constitute the database data (sensitive) data sets and the database log (insensitive) data sets are sent to the disk controller by local host 10 to enable the disk controller to distinguish between write instructions to the database data and to the local log. It is also specified to the disk controller 50 whether or not the capability is required of recovery to the closest consistent state. This information is passed to the disk controller by execution of a suitable instruction.

Figure 3:
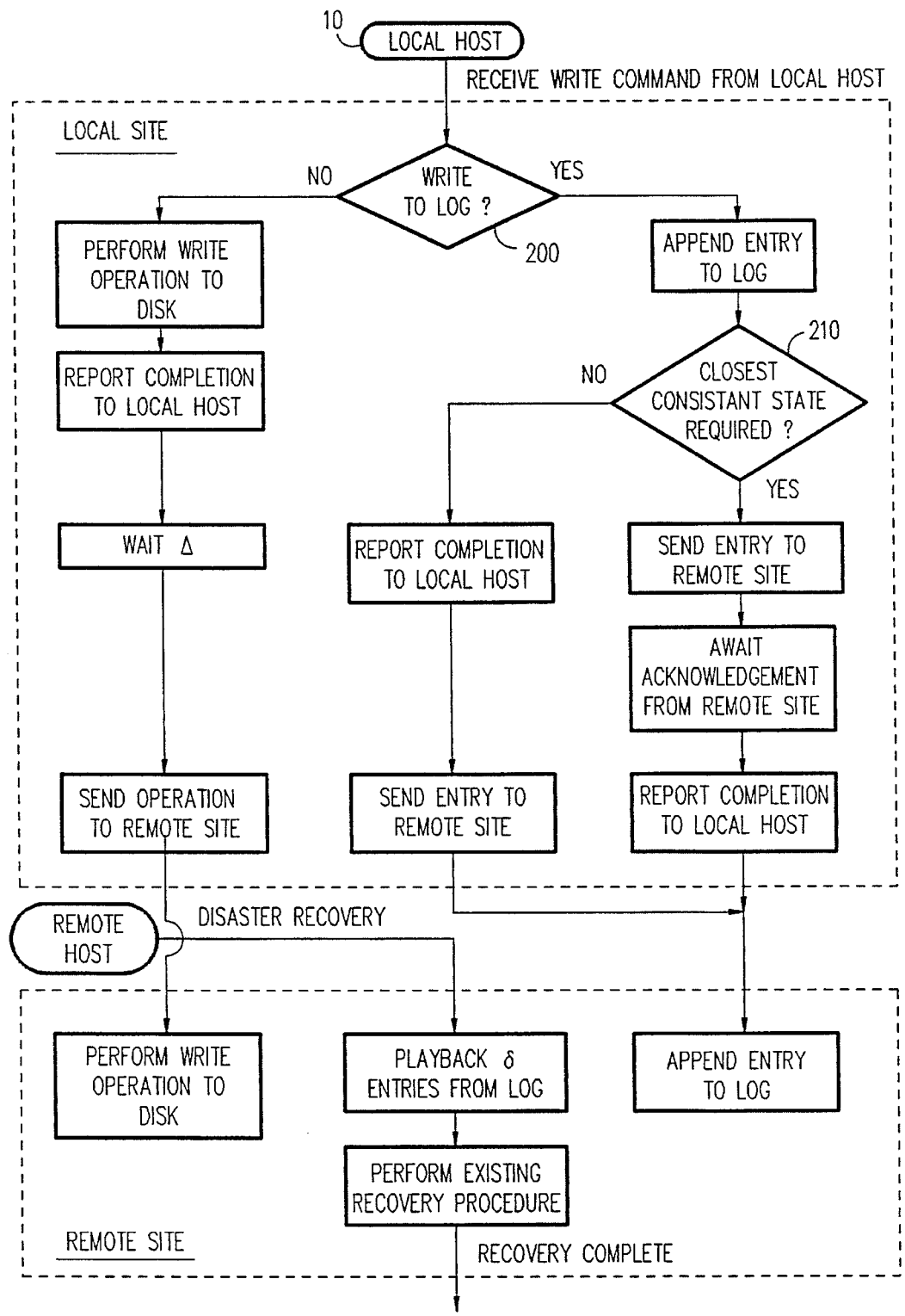
FIG. 3 is a flow diagram showing the operation of the mirrored copy maintenance and data recovery method in the disk control system of the preferred embodiment.

The backup method of the present invention consists of two procedures as illustrated in FIG. 3. These procedures are implemented as part of the microcode resident on disk controllers 50 and 60.

1. The procedure for maintaining the mirrored data at the remote site.

When the local host CPU 10 makes a write instruction to local disk control unit 50, the disk control unit determines in decision block 200 whether this is to an area of storage corresponding to the local database log. If so, it appends the entry to the local log and if the system has been set up, (by the setting of a software switch in decision block 210), so that it can be recovered to the closest consistent state it sends the log entry to the remote disk control unit, via peer to peer communication channel 75. Upon receipt of confirmation of successful write to the remote log, it then reports successful completion of the write to the local host CPU 10.

If the system has been set up so that recovery to the closest consistent state is not required, disk control unit 50 reports successful completion of the write to the local log to the local host and then sends the log entry to the remote disk controller 60. In this way the response time of the storage system is improved.

If, in decision block 200 it is determined that the write is not to a portion of storage reserved for the log, local disk controller 50 performs the write operation to the local disk, reports successful completion of the write to the local host 10, then waits for a predetermined time $\Delta$ before sending the write operation to the remote disk controller 60 for execution on the remote database data. If $\Delta$ is the upper limit on the communication delay in units of time between the local disk controller 50 and the remote disk controller 60 and updates of the database application data sets at the mirrored site are delayed for $\Delta$ time units, while updates to the remote database log are immediately applied, then the log will always stay ahead of the file system.

2. The recovery procedure.

Recovery of the database following destruction of the local site is effected by executing the recovery procedure normally provided by the database management system after having executed the remote log entries against the database data from the log entry $\delta$ entries from the end of the log, where $\delta$ is the maximum number of log entries that may be written in $\Delta$ unit of time.

From this point, for each complete entry (only the last entry may not be complete), in the log until the end of the log, the remote file system is updated according to the entry contents. When the procedure ends, the file system will ready for normal recovery. The closeness of the consistency depends on the currency of the log.

If $\delta$ is small, which is likely because the communication delay $\Delta$ will not be very large, the file system reconstruction will not take much time, since only $\Delta$ time worth of transactions need to be recovered.

Although particular embodiments of the invention have been described herein, those skilled in the art recognize that the present invention can be practiced by other than the described embodiments. The embodiments are presented for purposes of illustration and not limitation.

We claim:

1. A backup method for a database having at least one application data set and at least one log data set stored and maintained at a local location by a computer system having a central processing unit (CPU) comprising:

maintaining a mirrored copy of the database at a remote location in communication with the local location characterized in that a writing of updates to a database application data set at the remote location is delayed for an extra delay time in addition to the delay time inherent in sending records to the remote location, so that a total delay time for writing updates to an application data set at the remote location is always at least as long as an upper limit on the data communication delay between the local location and the remote location and updates to a remote log data set for the database are executed after corresponding updates to a local log data set are executed without said extra delay time in addition to the delay time inherent in the sending of records to the remote location; and recovering a consistent copy of the database from the mirrored copy of the database and the remote log data set after destruction of the database at the local location by executing the remote log entries against the remote database data starting from an entry in the remote log a number of entries back from the end of the remote log at least as great as the maximum number of log entries which may be written in said delay time.

2. A method as claimed in claim 1 wherein a confirmation of a successful update to the local log is performed prior to making a corresponding update to the remote log.

3. A method as claimed in claim 1 wherein a confirmation of a successful update to the local log is performed after having made a corresponding update to the remote log.

4. A data storage system connectable to and for use with a computer database system having database data stored in a portion of storage in the data storage system and a database log stored in a reserved portion of storage in the data storage system, the data storage system being in communication with a remote: data storage system having a copy of the database data and the database log stored in portions of storage in the remote data storage system, the data storage system comprising:

logic means for executing a write instruction in the data storage system received from the computer database system;

logic means for communicating the write instruction from the data storage system to the remote data storage system for execution in the remote data storage system;

logic means for determining from the write instruction whether the write is to a portion of storage in the data storage system reserved for a database log;

logic means for delaying the initiation of the communication to the remote data storage system of a write instruction to a portion of storage in the remote data storage system not reserved for the database log for a time at least equal to the upper limit on the data communication delay between the data storage system and the remote data storage system; and logic means for executing the write instructions communicated to the remote data storage system against the copy of the database data stored in the remote data storage system, so that a consistent copy of the database data is recoverable from the copy of the database data and the copy of the database log stored in the remote data storage system after destruction of the data storage system.

5. A data storage system as claimed in claim 4 in the form of a disk controller connectable to a host processor, at least one disk drive unit and a remote similar disk controller.

6. An article of manufacture comprising:

a computer usable medium having computer readable program code means embodied therein for backing up a database having at least one application data set and at least one log data set stored and maintained at a local location, comprising:

computer readable program code means for executing a write instruction at the local location;

computer readable program code means for communicating the write instruction from the local location to a remote location in communication with the local location database;

computer readable program code means for determining from the write instruction whether the write is to a log data set of the local location database;

computer readable program code means for delaying the initiation of the communication to the remote location of a write instruction to an application data set for a time at least equal to the upper limit on the data communication delay between the local location database and the remote location database; and computer readable program code means for executing the write instructions communicated to the remote location against the copy of the application data set of the remote location database, so that a consistent copy of the local database is recoverable from the remote database after destruction of the local location database.

* * * * *

UNITED STATES PATENT AND TRADEMARK OFFICE
CERTIFICATE OF CORRECTION

PATENT NO. : 5,594,900
DATED : January 14, 1997
INVENTOR(S) : Cohn, et al.

It is certified that error appears in the above-indentified patent and that said Letters Patent is hereby corrected as shown below:

Column 6, Line 9 "remote:" should be --remote--.

Signed and Sealed this

Second Day of December, 1997

Attest:

BRUCE LEHMAN

Attesting Officer

Commissioner of Patents and Trademarks